United States Patent
Hwu et al.

(10) Patent No.: US 8,789,976 B2
(45) Date of Patent: Jul. 29, 2014

(54) INTEGRATED MULTI-LAYERED ILLUMINATING UNIT AND INTEGRATED MULTI-LAYERED ILLUMINATING ASSEMBLING UNIT

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 210 days.

(21) Appl. No.: 13/542,664

(22) Filed: Jul. 6, 2012

(65) Prior Publication Data

US 2014/0009939 A1    Jan. 9, 2014

(51) Int. Cl.
*F21V 29/00* (2006.01)
*F21V 21/00* (2006.01)
*F21V 19/00* (2006.01)

(52) U.S. Cl.
CPC ........... *F21V 29/2212* (2013.01); *F21V 19/003* (2013.01)
USPC ..................................... 362/294; 362/249.02

(58) Field of Classification Search
CPC .............. F21V 19/003–19/004; F21V 29/2212
USPC ..................................... 362/218, 249.02, 294
See application file for complete search history.

(56) References Cited

U.S. PATENT DOCUMENTS

| | | | | |
|---|---|---|---|---|
| 5,857,767 A | * | 1/1999 | Hochstein | 362/294 |
| 2006/0018099 A1 | * | 1/2006 | Chen | 361/709 |
| 2007/0230184 A1 | * | 10/2007 | Shuy | 362/294 |

\* cited by examiner

*Primary Examiner* — David V Bruce
(74) *Attorney, Agent, or Firm* — Lin & Associates IP, Inc.

(57) ABSTRACT

An integrated multi-layered illuminating unit and an integrated multi-layered illuminating assembling unit are provided in the disclosure. The illuminating unit provided in the present invention can be adapted to different purposes and locations of use through a flexible number of heat dissipating bases used and adaptable assembling methods, in other words, the present invention provides an illuminating unit which can be assembled into specific forms depending on different applications and purposes. The illuminating unit and can provide various irradiation intensity and rage, wherein the heat dissipating bases are connected and assembled with each other through connecting members with an easy, fast and convenient method, thus the illuminating unit provided is very time and effort saving regarding its production and maintenance.

14 Claims, 10 Drawing Sheets

INTEGRATED MULTI-LAYERED ILLUMINATING UNIT AND INTEGRATED MULTI-LAYERED ILLUMINATING ASSEMBLING UNIT

BACKGROUND OF THE INVENTION

1. Field of the Invention

The present invention relates to an illuminating unit, especially to an integrated multi-layered illuminating unit and assembling unit.

2. The Prior Arts

Illuminating units are indispensable necessities in our daily life which changed the way people live nowadays. Various illuminating units can be found in the general homes or indoors of public areas, such as fluorescent lamps, illuminating lamps, table lamps, ceiling lamps and neon lamps. These illuminating units can eliminate the inconvenience caused by darkness.

The application and usage can be different between different illuminating units. For example, fluorescent lamps, illuminating lamps and table lamps are used for general illuminating purpose, and the night lamps are used specially for illumination prior to bed. The night lamps have a lower luminous power for its ancillary purpose. Nevertheless, the conventional lamp tubes and bulbs has the disadvantages of fast temperature rise and high power consumption and the lamp devices also causes environmental problems upon disposal; therefore, the light emitting diode (LED) is developed as the new technique of light source in recent years.

Although the LED has the advantages of low power consumption, long life, zero warm-up time and fast reaction time, the illuminating intensity of a general LED is still lower than the conventional lamp tubes and bulbs, therefore LEDs of high power is usually used as lighting source. The high power LED can provide a higher luminous intensity, however the temperature rise will effect the luminous efficiency when the LED is lit continuously; therefore, improving the illuminating and heat dissipating effect of LEDs is an important task for the developers.

SUMMARY OF THE INVENTION

The primary purpose of the present invention is to provide an integrated multi-layered illuminating unit, comprising a heat dissipating base and two lead wires. The heat dissipating base has a first front side and a second front side, at least one slot compartment is disposed on the first front side, and the second front side forms a plurality of cooling fins. A base surface and an inner circular wall are disposed in a slot compartment thereof, wherein a plurality of emitting elements which are wire bonded to each other are installed on the base surface, and two openings are disposed between the second front side and the base surface of the slot compartment; the two lead wires are wired bonded to the emitting elements to form electrical connections, and two lead frames are installed through the two openings, wherein the closer end of the two openings to the slot compartment is sealed with a sealing material, and the further end of the two openings from the slot compartment is sealed and fixated with a plug, and then the space between two openings is filled with a polymer compound.

Another purpose of the present invention is to provide an integrated multi-layered illuminating assembling unit, comprising a plurality of heat dissipating bases and two lead wires. The plurality of heat dissipating bases, wherein any two of the adjacent heat dissipating bases can be connected and fixated by a plurality of connecting members. A heat dissipating base thereof has a first front side and a second front side, at least one slot compartment is disposed on the first front side, and the second front side forms a plurality of cooling fins. A base surface and an inner circular wall are disposed in a slot compartment thereof, wherein a plurality of emitting elements which are wire bonded to each other are installed on the base surface, and two openings are disposed between the second front side and the base surface of the slot compartment; the two lead wires are wired bonded to the emitting elements to form electrical connections, and two lead frames are installed through the two openings, wherein the two ends of the two openings are sealed with a sealing material, and the space between two openings is filled with a heat-resistant polymer compound.

The illuminating unit provided in the present invention can be adapted to different purposes and locations of use through a flexible number of heat dissipating bases used and the adaptable assembling method. Multiple heat dissipating bases are connected and assembled with each other through connecting members 1 with an easy, fast and convenient method, thus providing a time and effort saving production and maintenance process. In short, the illuminating unit provided in the present invention can be assembled into suitable forms according to different applications and purposes of usage to provide various irradiation intensity and range.

DETAILED DESCRIPTION OF THE PREFERRED EMBODIMENT

The present invention will be apparent to those skilled in the art by reading the following detailed description of preferred embodiments thereof, with reference to the attached drawings.

Figure 1:
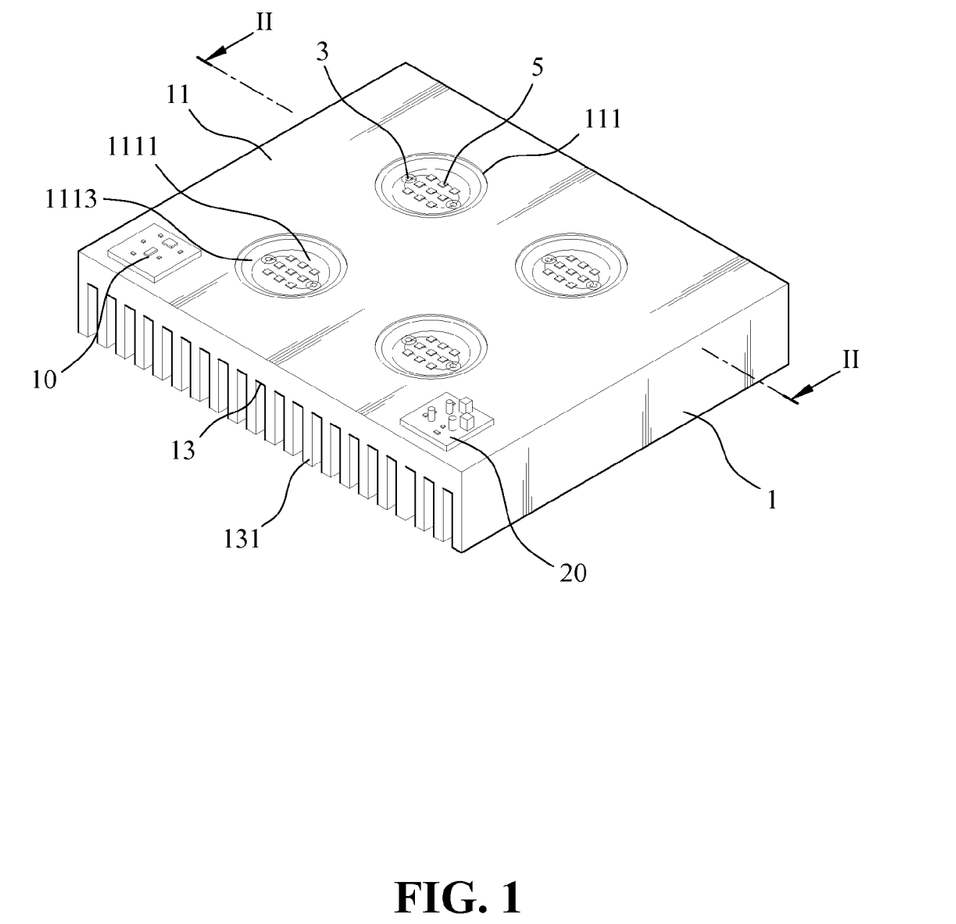
FIG. 1 is a perspective view showing an integrated multi-layered illuminating assembling unit of the present invention.
Figure 2:
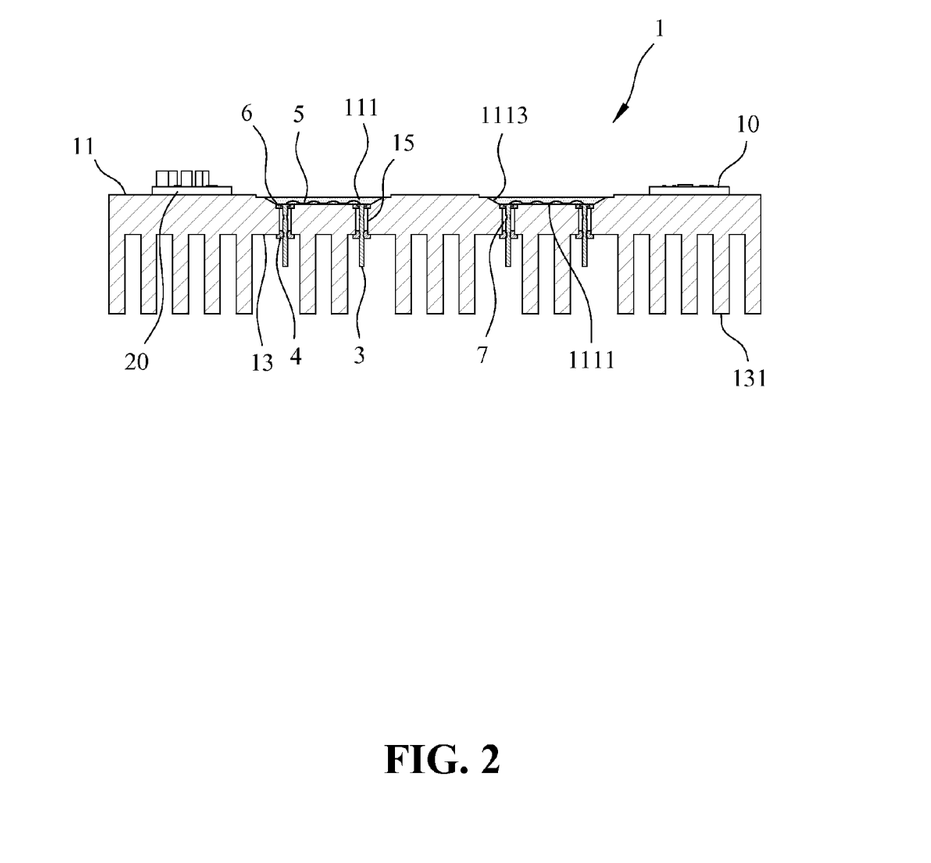
FIG. 2 is a section view showing an integrated multi-layered illuminating assembling unit of the present invention.

FIG. 1 is a perspective view showing an integrated multi-layered illuminating assembling unit of the present invention, and FIG. 2 is a section view showing an integrated multi-layered illuminating assembling unit of the present invention.

The present invention relates to an integrated multi-layered illuminating unit which can adapt to different purposes and locations of use by assembling with multiple units thereof to improve the illuminating range and intensity.

An integrated multi-layered illuminating unit of the present invention mainly comprises a heat dissipating base 1 and two lead wires 3.

The heat dissipating base 1 includes a first front side 11 and a second front side 13, wherein the second front side 13 is located on the opposite side of the first front side 11 of the heat dissipating base 1, and at least one slot compartment 111 is disposed on the first front side 11. As shown in the preferred embodiment of FIG. 1, four slot compartments 111 which are arranged in pairs can be disposed. The second front side 13 forms a plurality of cooling fins 131 where the cooling fins have a gap between each fin.

Figure 3:
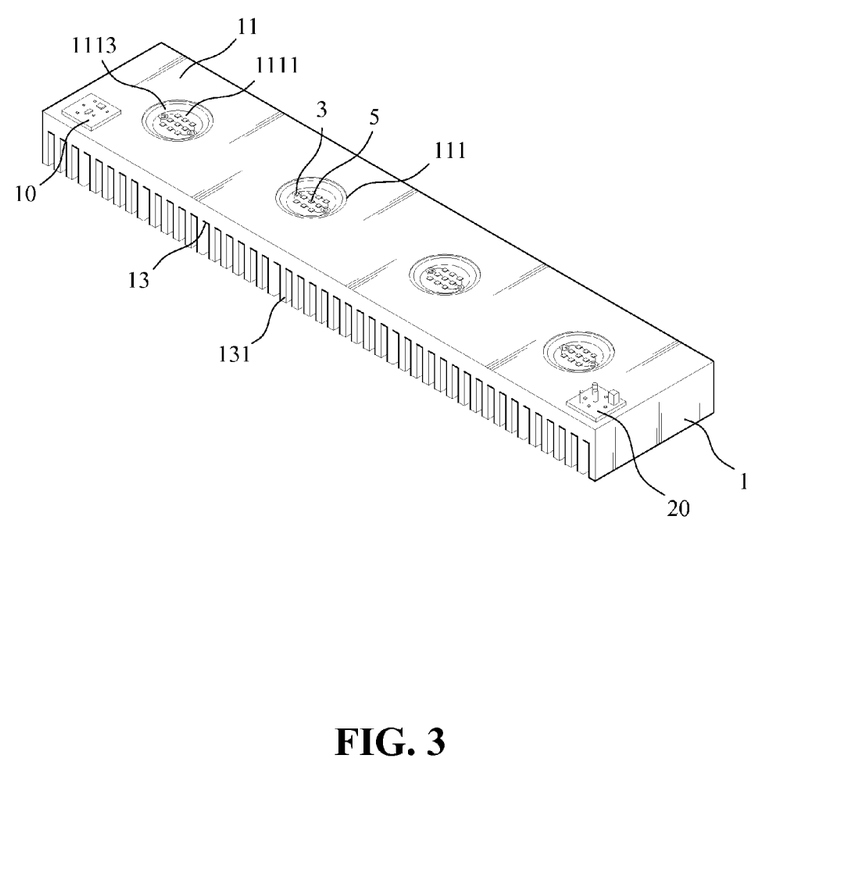
FIG. 3 is a schematic view showing a preferred embodiment of a heat dissipating base of the present invention.

It should be noted that the number and the configuration of slot compartments 111 should be decided according to the actual needs and situation, so is the shape of the heat dissipating base 1. The preferred embodiment described here is for illustrating purpose only, and the scope and variations of the present invention is not limited thereto. The heat dissipating base 1 can also be the rectangle shape shown in FIG. 3, so the slot compartments 111 are arranged in a straight line with intervals.

As shown in FIG. 1 and FIG. 2, a base surface 1111 and an inner circular wall are disposed in the slot compartment 111 of the heat dissipating base 1, wherein an emitting element 5 is disposed on the base surface 1111 and the emitting element 5 is wire bonded to each other. Two openings 15 are disposed between the second front side 13 and the base surface 1111 of the slot compartments 111. The light emitting elements 5 are arranged in arrays, and can be LEDs or other elements with illuminating functions.

The inner circular wall 1113 is an inclined plane so the light emitted by the emitting element 5 can be reflected by the inner circular wall 1113 to the outside of the slot compartments 111. A reflective mask (not shown in graph) can be installed on the inner circular wall to improve the reflective rate of the emitting element 5, so the irradiation intensity and uniformity of the emitting element 5 are enhanced.

As shown in FIG. 2, two lead wires 3 are wired bonded to the emitting elements 5 to form electrical connections, and two lead frames are installed through the two openings 15, wherein the closer end of the two openings 15 to the slot compartment 111 is sealed with a sealing material 6, and the further end of the two openings 15 from the slot compartment 111 is sealed and fixated with a plug 4. Other than isolating moisture and dust, the sealing material 6 and the plug 4 also serve to fixate two lead frames 3. The sealing material 6 can be silicone resins or epoxy resins with high attachment and high temperature tolerance. The better silicone resins choice should have zero light transmittancy, so when the light emitted by the emitting element 5 incident the silicone resins, the silicone with zero light transmittancy can reflect the emitted light from the emitting element 5 to the outside of the slot compartments 111, therefore improves the light transmission efficiency.

The space within the two openings 15 can be filled with a polymer compound 7 with high heat conduction performance, so two lead frames 3 are embedded and the heat generated can be dissipated to heat dissipating base 1 quickly.

A wireless transmission unit 10 and a power supply unit 20 can be installed on the heat dissipating base 1, wherein the wireless transmission 10 can be a standard IEEE802.11 wireless transmission module or a Bluetooth transmission module, and is at least one of them.

Figure 4:
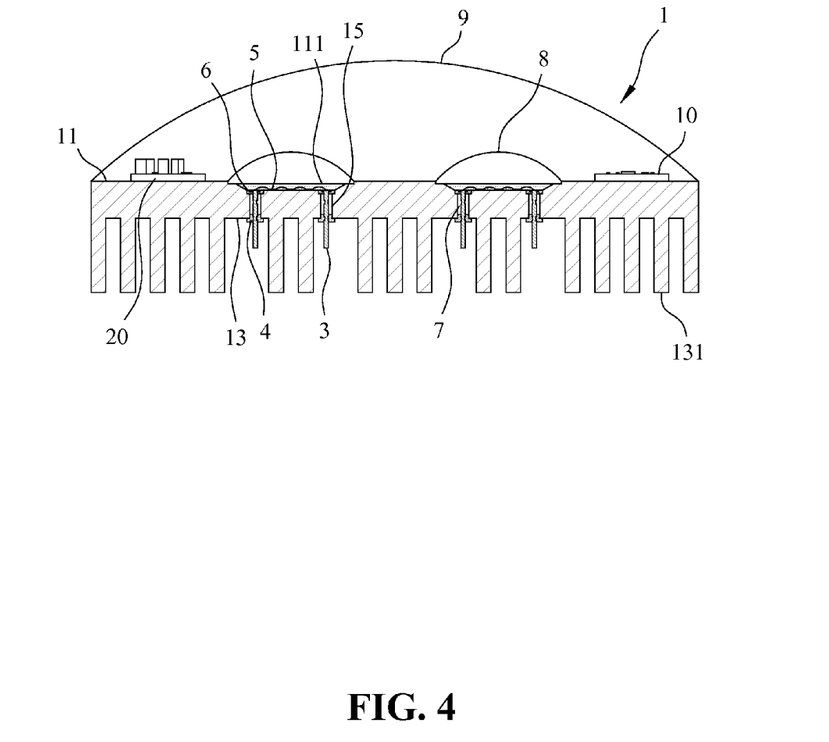
FIG. 4 is a schematic view showing the first preferred embodiment of an integrated multi-layered illuminating assembling unit of the present invention.

FIG. 4 shows a schematic view of the first preferred embodiment of an integrated multi-layered illuminating assembling unit of the present invention. Followed by the previous description, the present invention can further comprise an optical mask 8 and a diffusing mask 9. The optical mask 8 is located on the light emitting element 5 and is connected with the slot compartment 111, so the slot compartment 111 becomes an enclosed space to prevent moisture and dusts from entering. The diffusing mask 9 is located on the heat dissipating base 1 and is connected with the heat dissipating base. The optical mask 8 and the diffusing mask 9 are used to diffuse the light emitted by the emitting element 5, so the irradiation uniformity can be enhanced.

Figure 5:
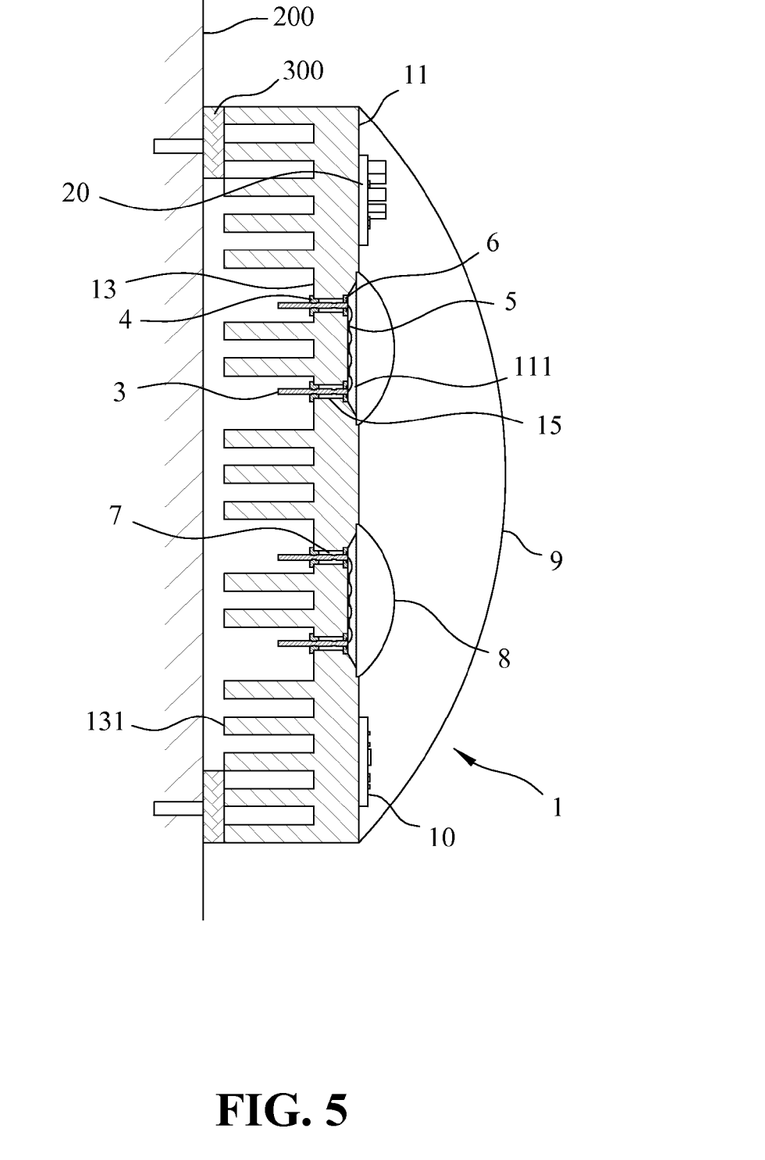
FIG. 5 is a utilization drawing showing an integrated multi-layered illuminating assembling unit of the present invention.

FIG. 5 shows a utilization drawing of an integrated multi-layered illuminating assembling unit of the present invention. The heat dissipating base 1 can be installed on a wall 200 with a heat insulating block 300 in between. Through the installation of heat insulating block 300, a space for ventilation is generated between the heat dissipating base 1 and the wall 200. Therefore, the heat generated from the heat dissipating base 1 can be conducted to the ventilating space described above, and the heat can be dissipated quickly by the ventilation of the air.

Figure 6:
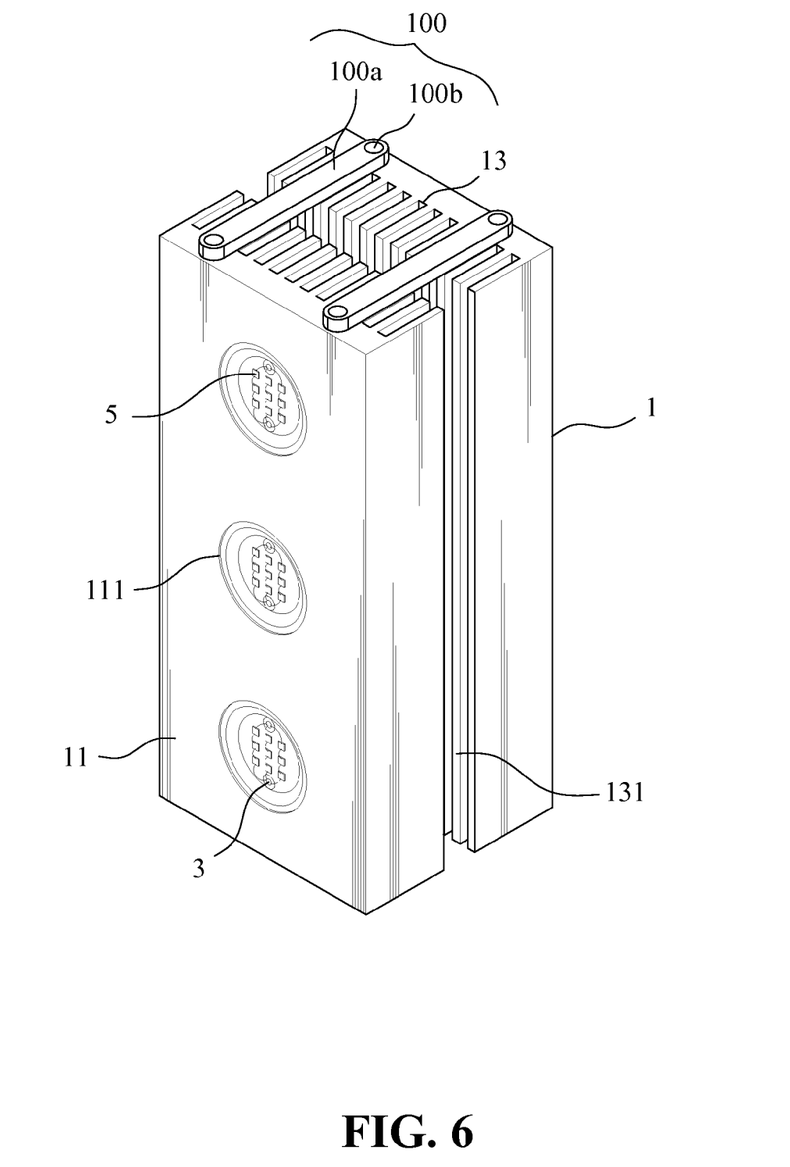
FIG. 6 is a schematic view showing the second preferred embodiment of a multi-layered illuminating assembling unit of the present invention.

The present invention can be assembled with a plurality of the heat dissipating bases 1, wherein any two adjacent heat dissipating bases 1 can be assembled into different forms of illuminating units by installing the connecting members 100, as shown in FIG. 6. The structure of the heat dissipating base 1 thereof and the assembling relations with the emitting element 5 and the lead wires 3 are described in the paragraphs above therefore will not be mentioned here again.

FIG. 6 shows a schematic view of the second preferred embodiment of a multi-layered illuminating assembling unit of the present invention. Two heat dissipating bases 1 thereof can be assembled and the two heat dissipating bases 1 are configured correspondingly, so the two corresponding sides of the two heat dissipating bases 1 are connected through two connecting members 100. The connecting member 100 includes a connecting grip 100*a* and two screws 100*b*. In order to assembled the two heat dissipating bases 1, the connecting grip 100*a* is placed in a way that the two ends of the connecting grip 100*a* are on the same side of the two heat dissipating base 1 separately, and then the two screws 100*b* are fastened on the two ends of the connecting grip 100*a* to be screwed into the heat dissipating base 1.

In the preferred embodiment, the two connecting members are fixated on the top and bottom of the heat dissipating base 1 separately, with the second front side 13 of the two heat dissipating base 1 facing each other. In other words, the cooling fins 131 of the two heat dissipating bases 1 are facing each other, therefore the slot compartments 111 which are installed with the emitting element 5 should be set up facing outward. Through such configuration of the heat dissipating bases 1, the assembled illuminating unit can have two light beams projecting in different directions, so the irradiation range can be enlarged.

Furthermore, the thickness between the cooling fins 131 of the second front side 13 and the emitting element 5 of the first front side 11 is very thin, thus the heat generated from the light emitting element 5 can be conducted to the cooling fins 131 on the other side immediately. In addition, the ventilating air between the cooling fans 131 can conduct the heat away to keep the heat from building up; therefore, the emitting element 5 can work under proper temperature continuously to keep up the best luminous efficiency.

Figure 7:
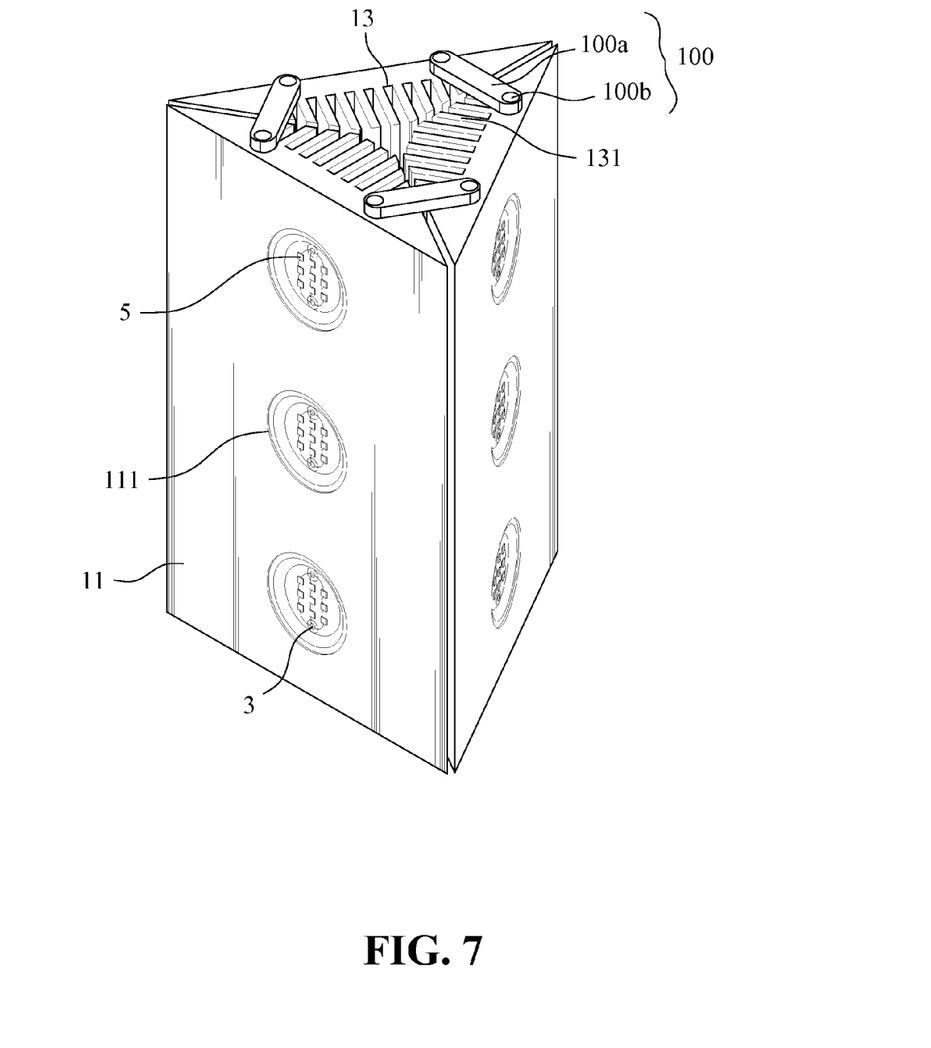
FIG. 7 is a schematic view showing an assembling unit type of an integrated multi-layered illuminating assembling unit of the present invention.
Figure 8:
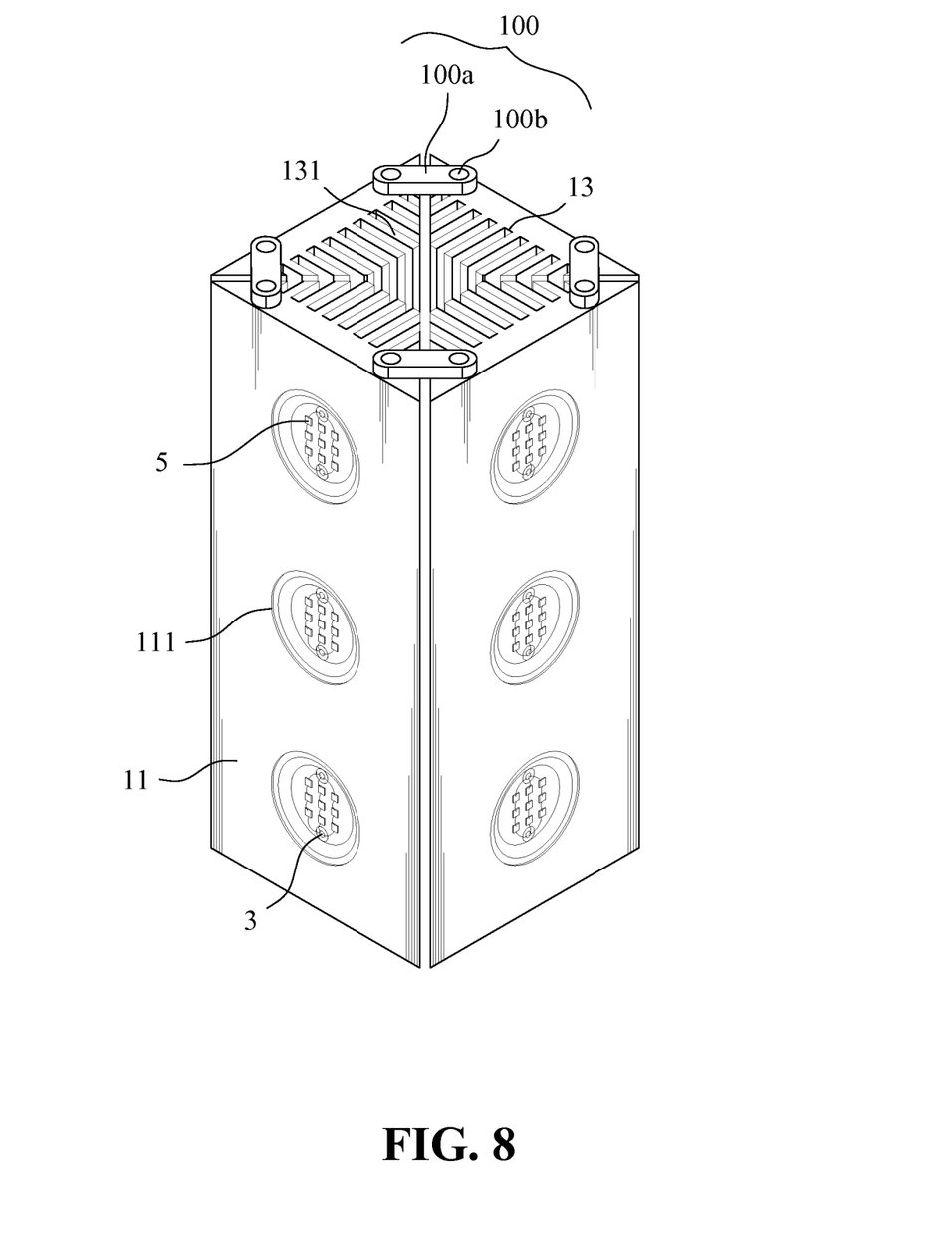
FIG. 8 is a schematic view showing another assembly type of an integrated multi-layered illuminating assembling unit of the present invention.
Figure 9:
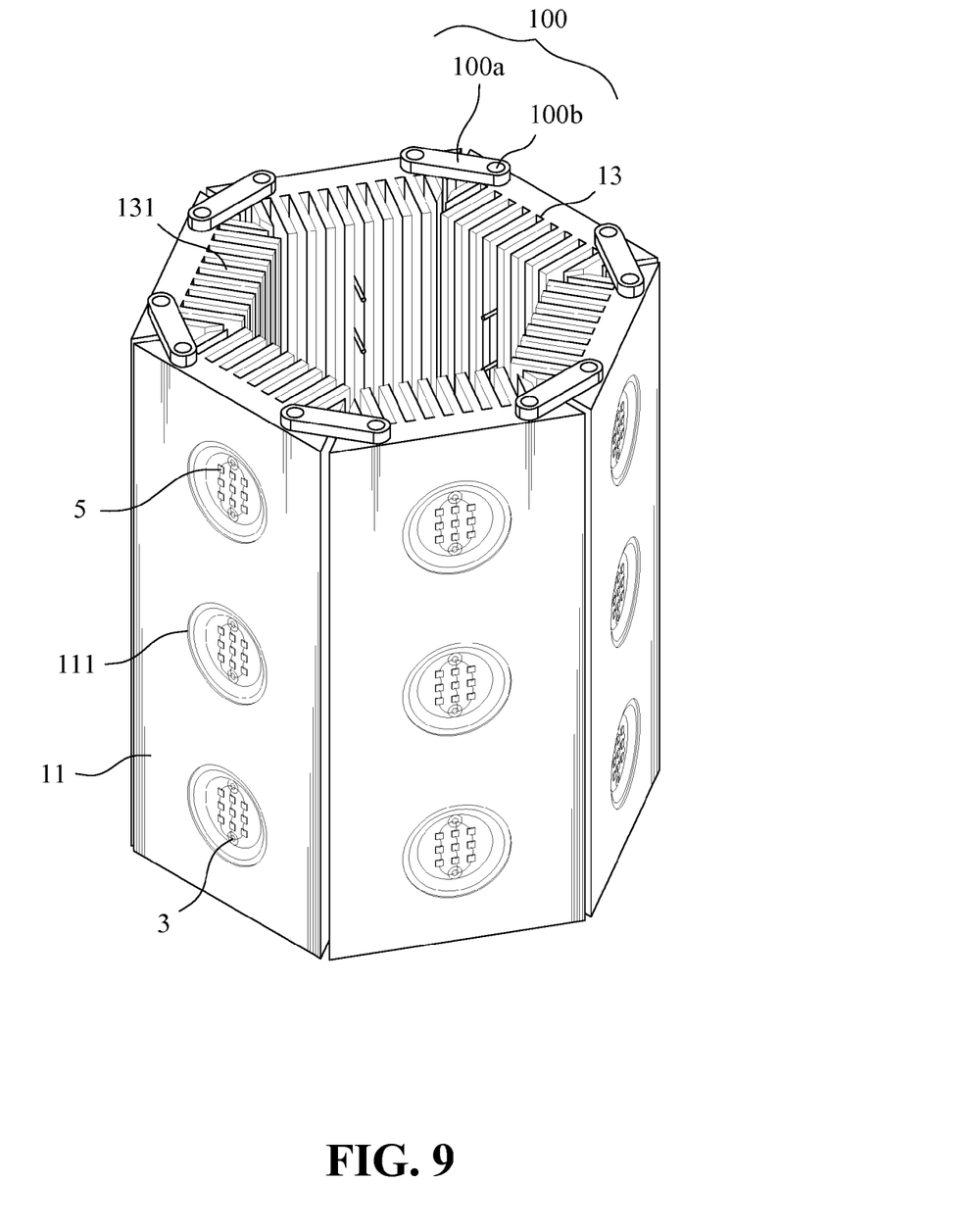
FIG. 9 is a schematic view showing another assembly type of an integrated multi-layered illuminating assembling unit of the present invention.

As shown in FIG. 7, FIG. 8 and FIG. 9, the heat dissipating bases 1 can be arranged into a triangular, quadrilateral, polygon and other possible shapes of illuminating unit depending on the actual number of assembling units used. The sides of the heat dissipating bases 1 can be set as chamfered surface, so the adjacent heat dissipating base 1 can be more united and closer to each other when assembled.

All the slot compartments 111 with the emitting elements 5 should be set up facing outward. As shown in FIG. 7, the preferred embodiment uses three heat dissipating bases 1. The illuminating unit can be a triangular shape illuminating unit with three directions of light beams through proper configuration and assembling. When the emitting elements 5 in all three heat dissipating bases are lit simultaneously, the triangular illuminating unit will give a lighting effect of 360 degrees visually. Therefore, the irradiation range and intensity of the illuminating unit can be increase multiply.

Figure 10:
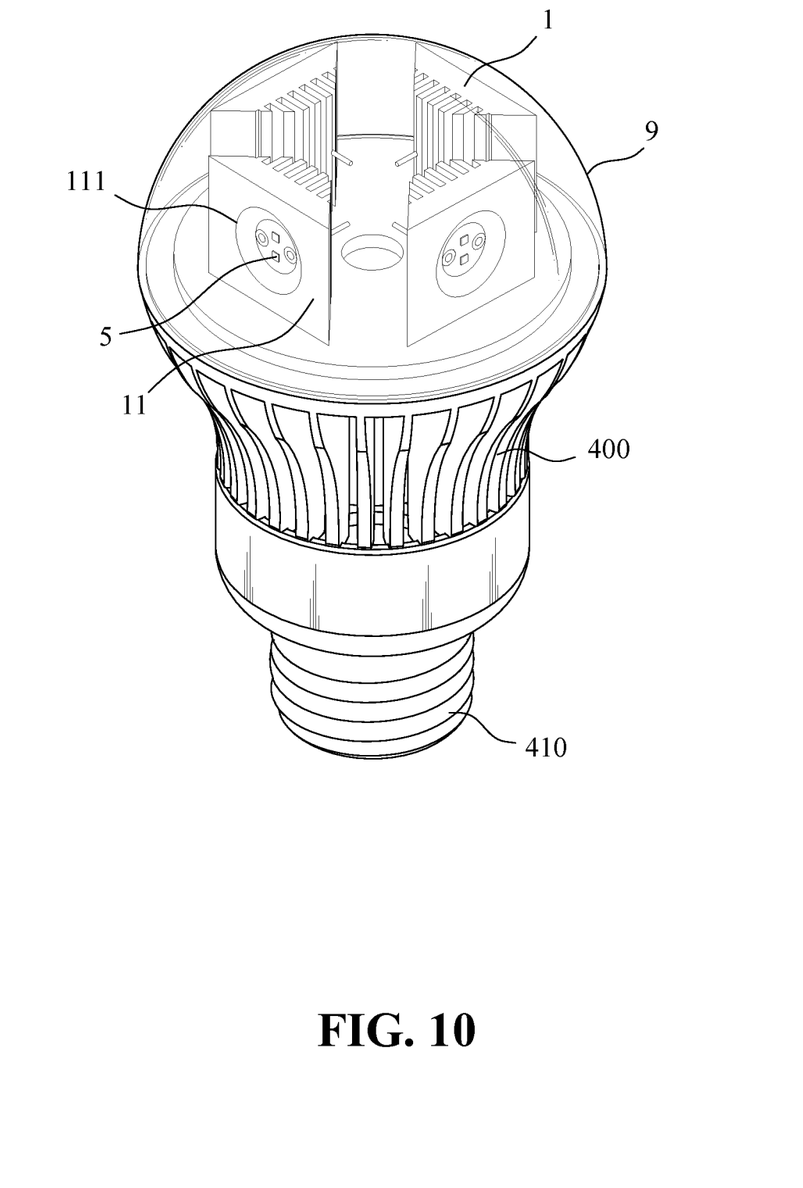
FIG. 10 is a schematic view showing the third preferred embodiment of an integrated multi-layered illuminating assembling unit of the present invention.

FIG. 10 shows a schematic view of the third preferred embodiment of an integrated multi-layered illuminating assembling unit of the present invention. The heat dissipating base 1 can be installed onto the lamp body 400, wherein the lamp body 400 can cover the diffusing mask 9, and a lamp fitting 410 is disposed on the bottom of the lamp body 400. The lamp body 400 has a containing space (not shown on graph) within, where the wireless transmission unit 10 and the power supply unit 20 can be installed in. This preferred embodiment uses the lamp body 400 of a sphere bulb as example; however, the scope of the invention should not be limited hereto. All the lamp bodies of an illuminating device are included in the scope of the invention.

As shown in FIG. 10, four heat dissipating bases 1 are used and the first front side 11 of the four heat dissipating bases 1 are facing outward of the lamp body 400. Preferably, the four heat dissipating bases 1 are arranged in pairs to form a quadrilateral shape. When the emitting elements 5 of the four heat dissipating bases are lit simultaneously, the quadrilateral illuminating unit will give a lighting effect in all directions visually. Therefore, the irradiation range and intensity can be increased multiply.

The advantage of the disclosure is that the number of the heat dissipating base 1 used to assemble the illuminating unit can be determined based on the purpose and the location of use, and so is the assembling method. In addition, the assembling of the heat dissipating bases only relies on the connecting members 100, and the actual operation of the connecting members is very convenient, fast and simple, thus the production and maintenance process are very time and cost saving. In short, the illuminating unit provided by the present invention can be assembled into suitable forms based on different applications and purposes of use to provide proper irradiation range and intensity.

The preferred embodiment described above is disclosed for illustrative purpose but to limit the modifications and variations of the present invention. Thus, any modifications and variations made without departing from the spirit and scope of the invention should still be covered by the scope of this invention as disclosed in the accompanying claims.

What is claimed is:

1. An integrated multi-layered illuminating unit, comprising:
    a heat dissipating base, which includes a first front side and a second front side, at least one slot compartment is disposed on the first front side, and the second front side forms a plurality of cooling fins; a base surface and an inner circular wall are disposed in a slot compartment thereof, wherein a plurality of emitting elements which are wire bonded to each other are installed on the base surface, and two openings are disposed between the second front side and the base surface of the slot compartment; and
    two lead wires, which are wired bonded to the emitting elements to form electrical connections, and two lead frames are installed through the two openings, wherein the closer end of the two openings to the slot compartment is sealed with a sealing material, and the further end of the two openings from the slot compartment is sealed and fixated with a plug, and then the space between two openings is filled with a polymer compound.

2. The integrated multi-layered illuminating unit as claimed in claim 1, wherein the inner circular wall is an inclined plane.

3. The integrated multi-layered illuminating unit as claimed in claim 2, further comprising a reflective mask which is disposed on the inner circular wall.

4. The integrated multi-layered illuminating unit as claimed in claim 1, wherein the sealing material can be silicone resins or epoxy resins, and is at least one of them.

5. The integrated multi-layered illuminating unit as claimed in claim 1, wherein a wireless transmission unit and a power supply unit can be installed on the heat dissipating base.

6. The integrated multi-layered illuminating unit as claimed in claim 1, wherein the wireless transmission unit is a standard IEEE802.11 wireless transmission module or a Bluetooth transmission module, and is at least one of them.

7. The integrated multi-layered illuminating unit as claimed in claim 1, wherein the emitting elements are arranged in arrays.

8. The integrated multi-layered illuminating unit as claimed in claim 1, wherein the emitting elements can be a lighting emitting diode.

9. The integrated multi-layered illuminating unit as claimed in claim 1, further comprising an optical mask and a diffusing mask, wherein the optical mask is located on the emitting element and is connected to the slot compartment, so the slot compartment becomes an enclosed space, and the diffusing mask is located on and connected to the heat dissipating base.

10. The integrated multi-layered illuminating unit as claimed in claim 1, wherein the heat dissipating base can be fixated to a wall with at least one heat insulating block in between.

11. An integrated multi-layered illuminating assembling unit, comprising:
    a plurality of heat dissipating bases, wherein any two of the adjacent heat dissipating bases can be connected and fixated by a plurality of connecting members; a heat dissipating base thereof has a first front side and a second front side, at least one slot compartment is disposed on the first front side, and the second front side forms a plurality of cooling fins; a base surface and an inner circular wall are disposed in a slot compartment thereof, wherein a plurality of emitting elements which are wire bonded to each other are installed on the base surface, and two openings are disposed between the second front side and the base surface of the slot compartment; and
    two lead wires, which are wire bonded to the emitting elements to form electrical connections, and two lead frames are installed through the two openings, wherein the two ends of the two openings are sealed with a sealing material, and the space between two openings is filled with a heat-resistant polymer compound.

12. The integrated multi-layered illuminating assembling unit as claimed in claim 11, wherein two heat dissipating bases can be assembled; the two heat dissipating bases are configured correspondingly, and two corresponding sides of the two heat dissipating bases are connected through two connecting members, the two front sides thereof are facing each other.

13. The integrated multi-layered illuminating assembling unit as claimed in claim 11, wherein the connecting member includes a connecting grip and two screws, the two screws penetrate through the two ends of the two connecting grips and are fastened on the two heat dissipating bases.

14. The integrated multi-layered illuminating assembling unit as claimed in claim 11, wherein the heat dissipating bases can be arranged into a triangular, quadrilateral or polygon shape, and can be arranged into at least one of the above, the sides of the heat dissipating bases can be set as chamfered surfaces.

\* \* \* \* \*